(12) United States Patent
Pang et al.

(10) Patent No.: US 6,363,624 B1
(45) Date of Patent: Apr. 2, 2002

(54) APPARATUS FOR CLEANING A SEMICONDUCTOR PROCESS CHAMBER

(75) Inventors: Lily L. Pang, Fremont; Thomas K. Cho, Palo Alto; Tetsuya Ishikawa, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/721,060

(22) Filed: Nov. 21, 2000

(51) Int. Cl.[7] .............................................. F26B 19/00
(52) U.S. Cl. .................................. 34/85; 34/91; 34/229; 204/298.07
(58) Field of Search .......................... 34/85, 91, 104, 34/201, 202, 204, 218, 229; 204/298.07; 156/345; 134/1.1, 1.2, 1.3, 22.1; 118/715, 719; 438/905, 906

(56) References Cited

U.S. PATENT DOCUMENTS

| 5,158,644 | A | 10/1992 | Cheung et al. ............. 156/643 |
| 5,785,796 | A | 7/1998 | Lee ............................. 156/345 |
| 6,015,591 | A | 1/2000 | Li et al. ................. 427/255.23 |
| 6,017,414 | A | 1/2000 | Koemtzopoulos et al. .. 156/345 |
| 6,077,412 | A | 6/2000 | Ting et al. .................. 205/143 |
| 6,121,161 | A | 9/2000 | Rossman et al. ........... 438/783 |
| 6,196,155 | B1 | 3/2001 | Setoyama et al. ... 118/723 MA |
| 6,217,658 | B1 | 4/2001 | Orczyk et al. .............. 118/697 |
| 6,228,229 | B1 | 5/2001 | Raaijmakers et al. .. 204/192.12 |
| 6,251,187 | B1 | 6/2001 | Li .............................. 118/715 |
| 6,286,451 | B1 | 9/2001 | Ishikawa et al. .......... 118/723 I |

Primary Examiner—Pamela Wilson
(74) Attorney, Agent, or Firm—Moser, Patterson & Sheridan

(57) ABSTRACT

An apparatus for distributing a cleaning gas to a semiconductor substrate processing chamber. The apparatus comprises a feed block disposed on top of the processing chamber and a support block disposed over the feed block. The feed block and the support block slidably interfit and are axially moveable with respect to one another.

34 Claims, 3 Drawing Sheets

APPARATUS FOR CLEANING A SEMICONDUCTOR PROCESS CHAMBER

BACKGROUND OF THE DISCLOSURE

1. Field of Invention

The present invention relates generally to apparatus for processing semiconductor wafers. More specifically, the invention relates to an apparatus for cleaning a semiconductor wafer process chamber.

2. Description of the Background Art

Semiconductor wafer processing chambers are susceptible to particle generation caused by condensate from processing gasses or reactants formed during processing. When the condensate accumulates on the various components of the chamber, a residue forms and is susceptible to flaking. Such flaking generates the particles (or contaminants) that are undesirable, since they can drift onto a wafer during processing. These contaminants can subsequently create shorts or voids in the devices formed in the processed wafer thereby degrading the quality of the wafer.

In particular, during a plasma assisted chemical vapor deposition process, processing gases are introduced into a chamber containing a semiconductor substrate, i.e. wafer. The wafer is supported and retained on a substrate support circumscribed by a process kit. The process kit assists in controlling the distribution of the gas over the semiconductor wafer. Once a plasma is formed, the process gas reacts with the wafer and deposits a desired material layer. During this process, the inner walls of the chamber, the substrate support, and the process kit, are subjected to the aforementioned residue, particles, or contaminants.

Removal of the residue is typically accomplished via a cleaning agent that is injected into the chamber from a cleaning device that is attached to a wall of the chamber. The cleaning device comprises a container having the cleaning agent (e.g., fluorine). The cleaning agent is used to etch the undesirable residue from the inner chamber walls and wafer support devices. However, present cleaning devices do not uniformly remove the unwanted residue from the various surface areas within the chamber.

Therefore, there is a need in the art for an apparatus that uniformly removes unwanted deposits from the chamber surfaces and components.

SUMMARY OF INVENTION

The disadvantages associated with the prior art are overcome by the present invention of an apparatus for cleaning a semiconductor substrate processing chamber. Specifically, the apparatus comprises a feed block disposed on top of the processing chamber and a support block disposed over the feed block. The feed block and the support block slidably interfit and are axially moveable with respect to one another.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

The present invention generally provides an apparatus for removing unwanted deposits in a semiconductor wafer processing chamber. The invention is illustratively described below as a chemical vapor deposition system, such as an ULTIMA® High Density Plasma Chemical Vapor Deposition (HDP-CVD) system, available from Applied Materials, Inc., of Santa Clara, Calif. However, it should be understood that the invention may be incorporated into other chamber configurations such as physical vapor deposition chambers, etch chambers, ion implant chambers and other semiconductor processing chambers. Particle residues accumulate in the chamber during semiconductor processes, such as deposition or etching, from the gases introduced into the chamber. Positioned above the chamber is a chamber cleaning kit that provides a cleaning agent from above the chamber as opposed to being introduced from a sidewall.

Figure 1:
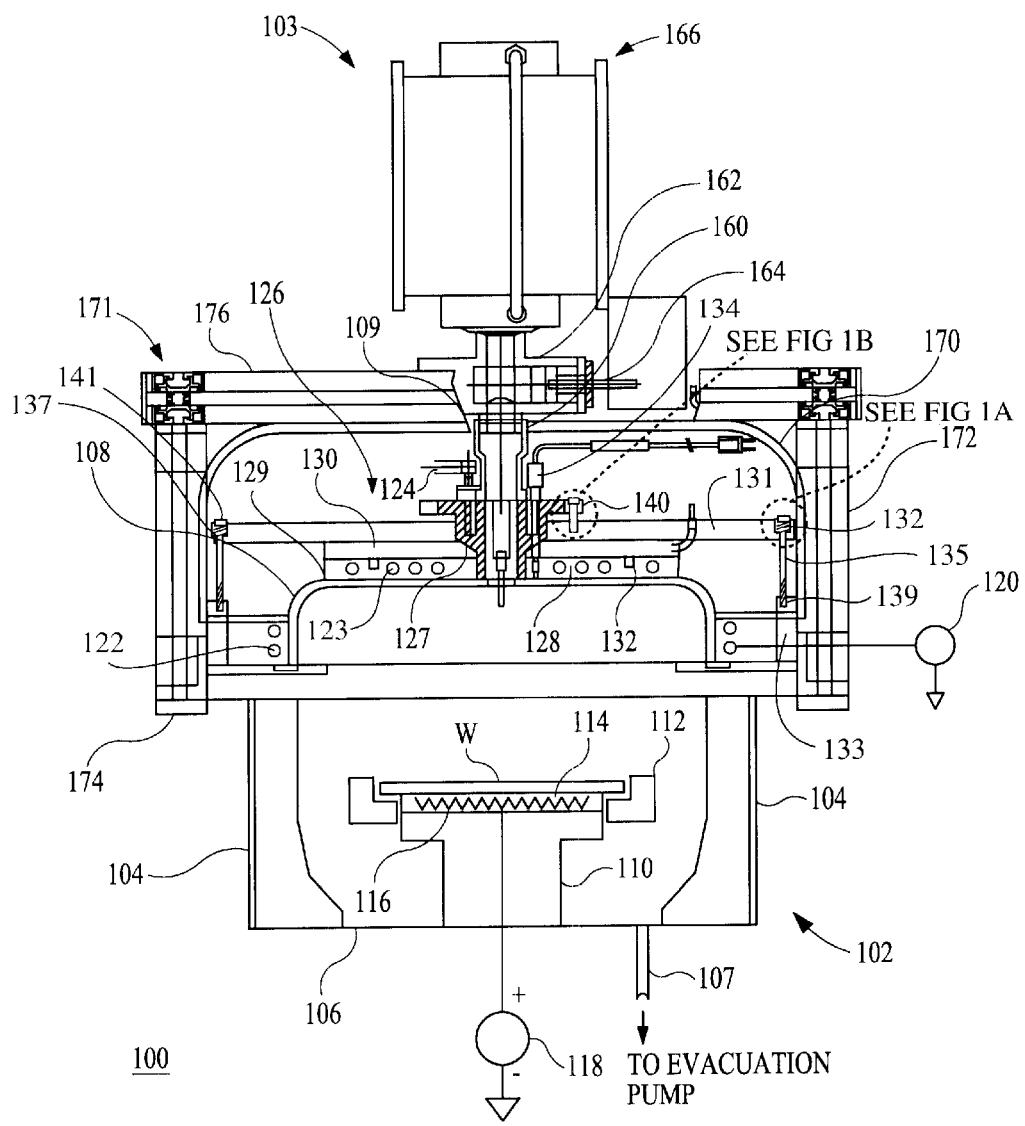
FIG. 1 depicts a cross-sectional view of a semiconductor processing system of the present invention.
Figure 1A:
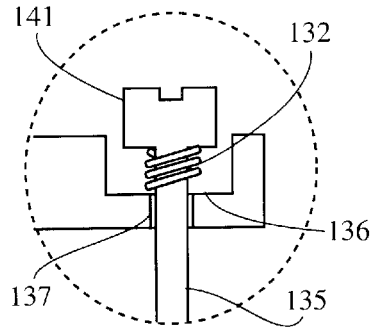
Figure 1B:
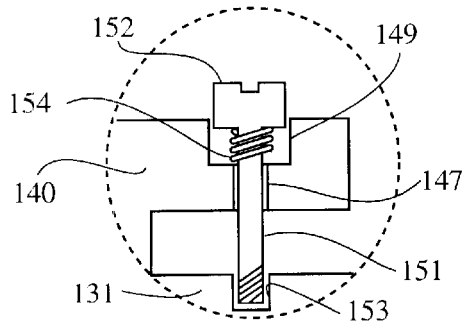

FIG. 1 depicts an illustrative deposition system 100 that generally comprises a chamber body 102 and a chamber cleaning kit 103. Specifically, the chamber body 102 comprises side walls 104, a bottom 106, and a dome 108 that defines an evacuable chamber for carrying out substrate processing. The system 100 may be one a number of substrate processing systems that are coupled to a semiconductor wafer processing platform such as a CENTURA® processing platform, available from Applied Materials, Inc. The system 100 includes a semiconductor substrate support 110 having a chuck 114, a heating electrode 116 coupled to a first power supply 118, and a process kit 112. A wafer "W" is retained to a top surface of the chuck 114 via chucking techniques known in the art, such as electrostatic chucking, vacuum chucking, and the like. Furthermore, the process kit 112 is utilized to prevent reactant products from the chemical vapor deposition from depositing on the underside of the wafer W or wafer support 110.

Processing gases are introduced into the chamber 102 via an external processing gas source port 124 from a external processing gas source (not shown). The processing gases may include $SiH_4$, $SiH_2Cl_2$, and $SiCl_4$ in conjunction with $NH_3$ and $N_2$, wherein a reactant silicon nitride (SiN) is formed. A second power source 120 external to the chamber 102 provides RF power to a first plurality of coils 122 circumscribing the dome 108, and a second plurality of coils 123 disposed over the dome 108 of the chamber 102 to create an electric field proximate the injected gases. The electric field generated by the coils 122 and 123 excites the gases into a plasma state. The excited process gases react with the semiconductor wafer W to form desired coatings and films (i.e., silicon nitride). Upon completion of the CVD process, the excess process and by-product gases are evacuated from the chamber 102 via exhaust port 107 connected to an external evacuation pump (not shown).

The dome 108 is fabricated from a dielectric material such as ceramic, quartz, and the like. Disposed above the dome 108 is a temperature control assembly 126 that is utilized to regulate the temperature of the dome 108 during the various process cycles, i.e., deposition cycle and cleaning cycle. The temperature control assembly 126 comprises a heating plate 128 and a cooling plate 130 disposed adjacent each to other and preferably having a thin layer of a thermally conductive material 129, such as grafoil disposed therebetween. The cooling plate 130 includes one or more fluid passages therein through which a cooling fluid, such as water is flowed. The heating plate 128 preferably has one or more resistive heating elements (not shown disposed therein to provide heat to the dome 108 during the cleaning cycle. The heating plate 128 is fabricated from a dielectric material that is electrically insulative and thermally conductive. Preferably the heating plate 128 is fabricated from aluminum nitride (AlN), however other materials known in the art may be used. In addition, the second plurality of coils 123 is disposed within the heating plate 128.

The temperature control assembly 126 is mounted over the dome 108 by one or more temperature control assembly cross members 131 that is coupled to the cooling plate 130 and extends over at least one flange 133 extending radially outward from the dome 108. In one embodiment, the temperature control assembly cross member 131 is affixed to a pair of flanges 133 by a plurality of fasteners such as a plurality of bolts 135 each having a bolt head 141. Specifically, each bolt 135 passes through a corresponding bore 137 in the temperature control assembly cross member 131 and threadingly engages a corresponding bore 139 in the flange 133 to secure the temperature control assembly cross member 131 over the cooling plate 130, heating plate 128 and dome 108. As discussed above, the dome 108 is fabricated from a ceramic material, which has a low tensile strength. As such, the fastener, (i.e., bolt) 135 engages a spring 132 positioned in the temperature control assembly cross member 131 to reduce the tension or pressure exerted on the dome 108, while still securing the temperature control assembly 126 over the dome 108. In particular, the bore 137 in the temperature control assembly cross member 131 may have a counter bore 136 of a diameter greater than the bore 137 for supporting the spring 132 (i.e., a coiled spring). The bolt 135 passes through the coiled spring 132 such that when the bolt 135 engages the bore 139 in the flange 133, the bolt head 141 compresses the coiled spring 132 to a desired resistance. One skilled in the art will appreciate that other fasteners and support members may be utilized to secure the temperature control assembly 126 over the dome 108 without compromising the integrity of the dome 108. Furthermore, the springs 132 allow the cooling plate 130 and heating plate 128 to move when increases and decreases in temperature cause expansion and contraction between each plate and the dome 108. In addition, a controller 134 is connected to the temperature control assembly 126 to regulate the temperature of the dome 108 during processing.

Figure 2:
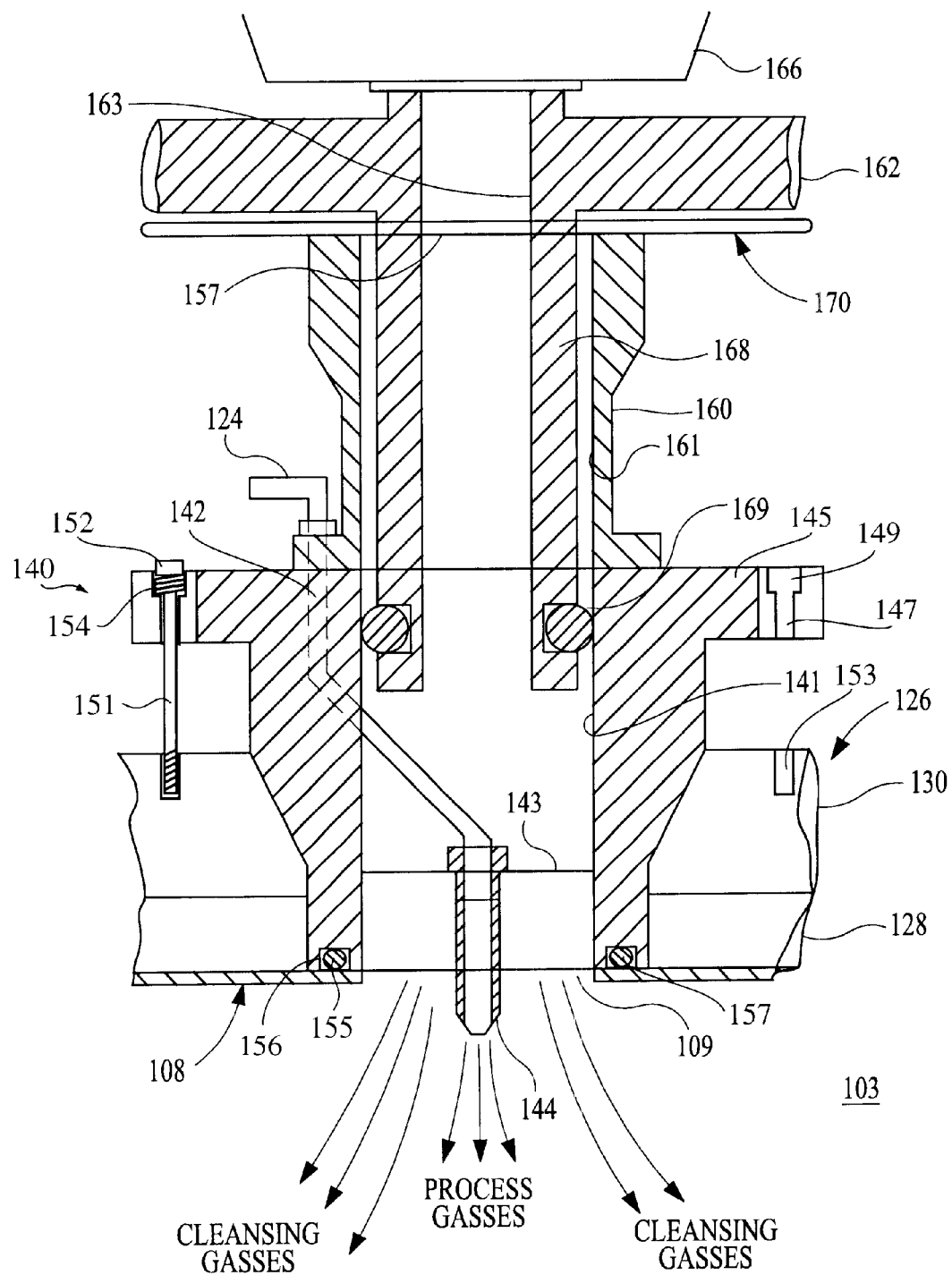
FIG. 2 depicts a cross-sectional view of a chamber cleaning kit in accordance with the present invention.

The chamber cleaning kit 103 comprises a cleaning agent generator 166, a support block 162, a slidable seal adapter 160, a top feed block 140, a cover 170, and a chamber cleaning kit support structure 171. FIG. 2 depicts a cross-sectional view of a chamber cleaning kit 103 of FIG. 1. Specifically, the top feed block 140 comprises a feed block channel 141 and is disposed over the temperature control assembly 126. The top feed block 140 extends through the cooling plate 130 and heating plate 128 of the temperature control assembly 126 and terminates on the top surface of the dome 108. The feed block 140 is a housing that permits the flow of gases through a bore 109 in the dome 108 and is attached to the temperature control assembly 126. An o-ring 155 is disposed in an o-ring groove 156 at a bottom edge 157 of the feed block 140 to provide a seal to prevent leakage of such gasses. In one embodiment, the feed block 140 comprises a flange 145 that extends radially outward and substantially parallel to the temperature control assembly cross member 131. The flange 145 comprises a plurality of bores 147 extending through the flange 145 and a counter bore 149 having a greater diameter than the bore 147 positioned at an upper portion of the flange 145. A plurality of fasteners such as a bolt 151 having a bolt head 152 (only one shown) passes through the bore 147 in the flange 145 and threadingly engages a threaded bore 153 disposed in the temperature control assembly cross member 131 to secure the feed block 140 thereon. In the preferred embodiment, a spring 154 such as a coiled spring is disposed in the counter bore 149 of the flange 145. During assembly, the each of the plurality of bolts 151 pass through the coiled spring 154. Upon threading each bolt 151 into the corresponding bores 153 in the temperature control assembly cross member, each bolt head 152 compresses the corresponding spring 154 in the counter bore 149 to a desired resistance. One skilled in the art will appreciate that other fasteners may be utilized to secure the feed block 140 to the temperature control assembly 126. In this manner, the springs 154 allow the feed block 140 to move when increases and decreases in temperature cause expansion and contraction between the cooling plate 130, heating plate 128 and the dome 108.

The slidable seal adapter 160 defines a seal adapter channel 161, which is axially aligned with the feed block channel 141 and is attached (preferably by bolting) to the feed block 140. A seal, such as a gasket (not shown) is disposed between the slidable seal adapter 160 and feed block 140 to provide a seal therebetween. One skilled in the art will recognize that the seal adapter 160 alternately may be an integral extension of the feed block 140. In one embodiment, the support block 162 comprises a hollow extension 168 (e.g., hollow piston) that forms a support block channel 163, which is slidably inserted into the seal adapter channel 161. Thus, the support block channel 163 is also in axial alignment with the seal adapter channel 161 and the feed block channel 141. In the embodiment depicted in FIG. 2, the piston 168 passes through the seal adapter 160 and extends into the feed block 140. However, a person skilled in the art will recognize that in another embodiment, the piston 168 may extend a length, or a portion of the length of the seal adapter 160.

In an alternate embodiment, the seal adapter 160 and corresponding seal adapter channel 161 may be coupled or integral with the support block 162. In such an arrangement, a hollow piston 168, having a diameter less than the seal adapter channel 161, is integral or coupled with the top of the feed block 140 such that the hollow piston 168 is axially aligned with the feed block channel 141. In this alternate configuration, the piston 168 extends from the feed block 140 and into the seal adapter channel 161 and support block 163. As such, the piston extends in a vertically upward direction to slidably engage the seal adapter channel 161 and support block 163, which is opposite of the downward direction as shown in the embodiment in FIG. 2.

Referring to FIG. 2, the cleaning agent generator 166 is disposed over and preferably bolted to the support block 162 whereby a cleaning agent such as disassociated fluorine is generated. Thus, the cleaning agent flows through the piston of the support block 162, the seal adapter 160, the feed block 140, the dome bore 109, and into the chamber 102 during a cleaning cycle. In this manner, the cleaning agent flow may be controlled from the clean gas generator 166 to the chamber 102.

Additionally, the feed block 140 comprises a process gas channel 142 extending through the feed block channel 141 and coupled to a nozzle 144 disposed therein. The nozzle 144 extends through the dome bore 109 and is secured within the feed block channel 141 via a nozzle support 143. In this manner, the process gas flows from the process gas source 124, through the process gas channel 142, the nozzle 144, and into the chamber 102 during a process (e.g., deposition) cycle. Accordingly, during the chamber cleaning cycle the cleaning agent from the cleaning agent generator 166 flow past the process gas channel 142 and the nozzle 144 with negligible effect on the cleaning agent flow.

Figure 3:
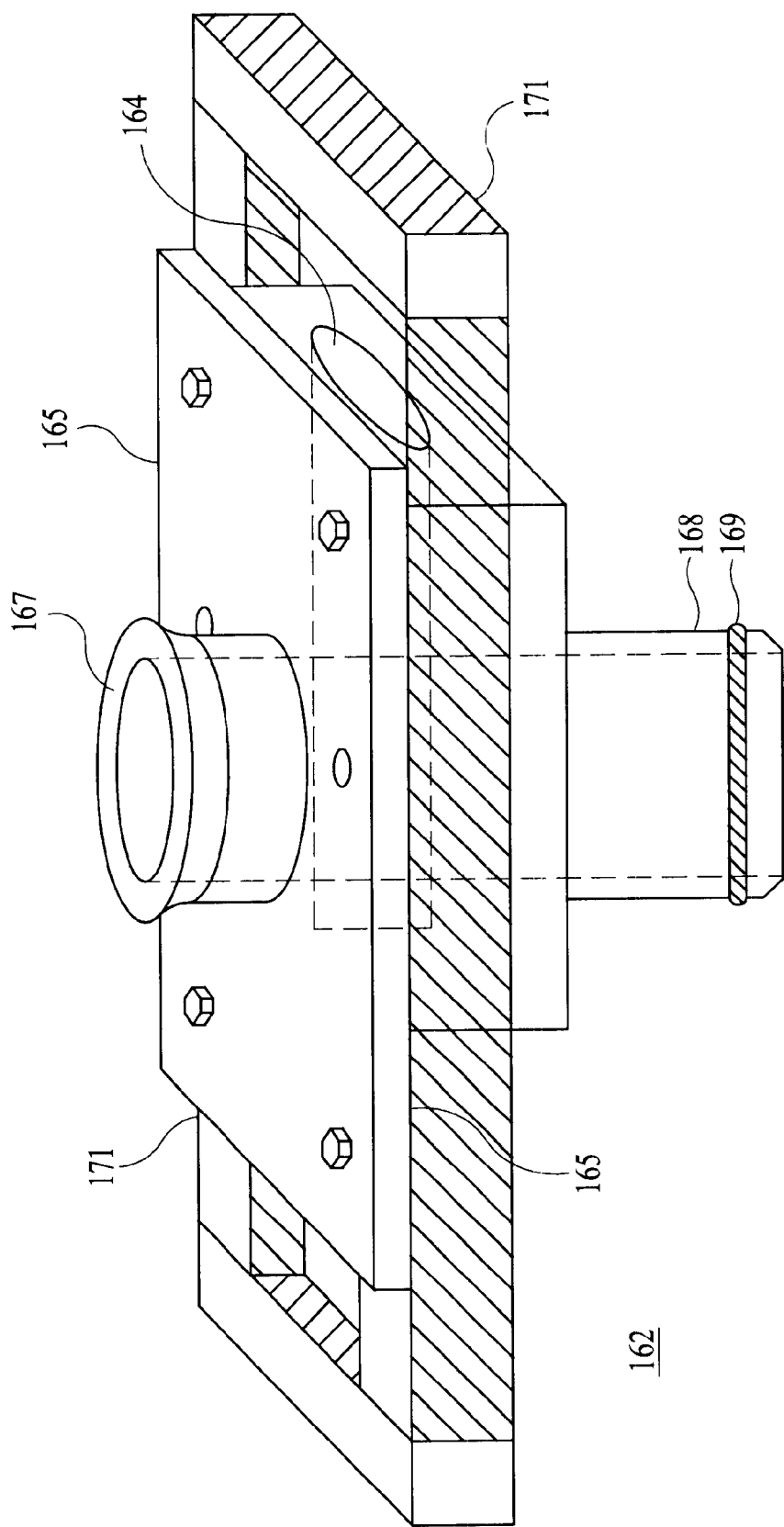
FIG. 3 depicts an isometric view of a support block of FIG. 1.

FIG. 3 depicts an isometric view of the support block 162 of FIG. 1. Specifically, the support block 162 comprises a flange 165, a top connector 167, and the piston 168 having an O-ring 169. The top connector 167 and the piston 168 are axially aligned. Moreover, the top connector 167 may be a any standard commercial connector such as an ISO, KF40, or the like capable of supporting the cleaning agent generator 166 and withstanding the heat and gasses produced during the processing and cleaning cycles. In one embodiment, the support block 162 comprises an orifice control valve 164 to control the flow of the cleaning agent stored in the cleaning agent generator 166. The orifice control valve 164 may be coupled to a controller (not shown) to automatically regulate such gaseous flow.

Referring to FIGS. 1 and 2, an outer cover 170 is disposed over, and encloses the chamber dome 108, the temperature control assembly 126, the top feed block 140, and the seal adapter 160. Specifically, an outer cover bore 157 permits the piston 168 of the support block 162 to protrude through the outer cover 170. Furthermore, the outer cover 170 is preferably fabricated from stainless steel, and is coupled to the ceramic dome 108 below the temperature control assembly 126. The outer cover 170 surrounds the aforementioned components so as to protect an operator from high temperatures generated by the chamber 108.

Additionally, the chamber cleaning kit support structure 171 is disposed over the outer cover 170 to brace the support block 162 and the cleaning agent generator 166. The cleaning kit support structure 171 is positioned such that the cleaning agent generator 166 is not influenced by the RF field generated by the plurality of coils 123 above the dome 108. Specifically, the support structure 171 comprises a plurality of legs 172 attached to a plurality of braces 174 coupled to the sidewalls 104 of the chamber 102. In one embodiment, four legs 172 are coupled to the chamber sidewalls 104 via four braces 174. Additionally, a cross-member 176 is coupled to each pair of legs 172 at an end opposed to each brace 174. Accordingly, the cross-members 176 form a substantially rectangular brace. The support block 162 is affixed to the each cross-member 176 by bolting the flange 165 of the support block 162 on opposing sides to each cross-member 176 (See FIG. 3). In this manner, the support block 162 is affixed to the support structure 171 to provide stability and alleviate stress on the ceramic dome 108 of the chamber 102 from the additional weight of the cleaning agent generator 166, support block 162, seal adapter 160 and feed block 141.

Referring to FIG. 2, the O-ring 169 is utilized to retain a seal between the walls of the feed block channel 141 and the piston 168 of the support block 162. Specifically, a temperature differential arises between the dome 108 and the support block 162 due to the plasma from the semiconductor wafer processing and the temperature control assembly 126. During operation, the temperature at the dome 108, and lower portion of the feed block 140 is greater than the temperature further away from the dome 108. Temperatures at the dome 108 may reach 200° C., while the temperature of the support block 162 may reach lesser temperatures in the range of 80° C. As the temperature changes during the semiconductor processing and cleaning cycles, the feed block 140, the seal adapter 160, and the piston 168 of the block support 162 will expand and contract, thereby creating thermal expansion of the feed block channel 141 and the seal adapter 160 relative to the piston 168 of the support block 162. The thermal expansion may be in a radial direction as between the piston 168 and feed block channel 141, or in axial alignment of the piston 168 and seal adapter channel 161. Such thermal expansion may cause leakage of the processing or cleaning agent, as well as place undesirable stresses on the dome 108 and chamber cleaning kit 103. Since the seal adapter 160 is rigidly fixed to the feed block 140, and the support structure 171 rigidly supports the support block 162 and cleaning agent generator 166, there is minimal room for displacement of the chamber cleaning kit 103 components. The only non-rigidly coupled connection in the chamber cleaning kit 103 is between the piston 168 and the seal adapter 160. As such, the O-ring 169 is disposed about the piston 168 at a distance from the dome 108 and lower portion of the feed block 140 to compensate for such thermal expansion and prevent any gaseous leakage. Furthermore, the distal location away from the dome 108 and lower portion of the feed block 140 reduces exposure of the O-ring 169 to such high temperatures, which degrades the O-ring's elasticity. To enhance the life of the O-ring, while still maintaining the necessary elasticity properties, the O-ring is preferably fabricated from a fluoropolymer such as CHAMREZ™, or the like. In this manner, the piston 168 in conjunction with the O-ring 169 and the piston adapter 160, inventively provide longevity to the chamber cleaning kit 103 by preventing undesirable stresses and gaseous leaks.

Thus, an inventive apparatus for cleaning a processing chamber has been disclosed. Such a chamber cleaning kit 103 as designed and disposed with respect to a process chamber enhances uniformity in the distribution of the cleaning agent in the process chamber during the cleaning cycle. Furthermore, the apparatus is mounted to the chamber dome 108 in a manner that yields to the thermal expansion and contraction of components due to the temperature differentials over the chamber cleaning kit.

Although the teachings of the present invention that have been shown and described in detail herein, those skilled in the art can readily devise other varied embodiments that still incorporate the teachings and do not depart from the spirit of the invention.

What is claimed is:

1. An apparatus for distributing a gas to a semiconductor substrate processing chamber comprising:
   a feed block disposed on top of said processing chamber; and
   a support block disposed over the feed block, said feed block and said support block slidably interfitting and axially moveable with respect to one another.

2. The apparatus of claim 1 wherein said support block comprises a support block channel for receiving a slidable piston coupled to said feed block.

3. The apparatus of claim 1 wherein said feed block comprises a feed block channel for receiving a slidable piston coupled to said support block.

4. The apparatus of claim 3 further comprising an o-ring disposed about said slidable piston and in contact with said feed block channel.

5. The apparatus of claim 3 wherein a cleaning agent generator is disposed on top of said support block.

6. The apparatus of claim 5 wherein said chamber comprises a dome having a dome bore where said feed block channel is axially aligned with said dome bore.

7. The apparatus of claim 6 further comprising a support structure coupled to said chamber for supporting said cleaning agent generator and said support block.

8. The apparatus of claim 7 wherein said support structure comprises:
   a plurality of legs coupled to opposing sidewalls of said chamber on a first end of said plurality of legs;
   a plurality of cross-members coupled to said plurality of legs at a second end of said plurality of legs.

9. The apparatus of claim 8 wherein said support block is disposed over said cross-members of said support structure.

10. The apparatus of claim 9, further comprising an outer cover having a bore, said outer cover disposed over said dome, wherein said dome, said feed block, and said temperature control assembly are shrouded by said outer cover, and said piston protrudes through said outer cover bore such that said support block and cleaning agent generator are disposed above said outer cover.

11. The apparatus of claim 8 wherein said support structure comprises four legs coupled to said sidewalls of said chamber, and four cross-members, each cross-member coupled to a pair of legs to form a rectangle.

12. The apparatus of claim 3 further comprising a seal adapter having a seal adapter channel, said seal adapter disposed between said feed block and said support block, and wherein said seal adapter channel is axially aligned with said feed block channel.

13. The apparatus of claim 12 wherein said piston slidably moves relative to said seal adapter and said feed block.

14. The apparatus of claim 12 further comprising a dome temperature control assembly disposed over said dome of said chamber and circumscribing said feed block.

15. The apparatus of claim 14 wherein said dome temperature control assembly further comprises:
   a heating plate;
   a cooling plate adjacent to said heating plate;
   a temperature control assembly cross member disposed over said heating plate and said cooling plate, said temperature control assembly cross member coupled to at least one flange extending radially outward from said dome.

16. The apparatus of claim 15 wherein said cross member is coupled to said flange via a spring loaded fastener.

17. The apparatus of claim 1 wherein said feed block further comprises a process gas channel.

18. A semiconductor wafer processing system, comprising:
   a chamber comprising a dome having a dome bore, and a semiconductor substrate support disposed within said chamber;
   a feed block disposed over and axially aligned with said dome bore;
   a support block disposed over said feed block channel, said feed block and said support block slidably interfitting and axially moveable with respect to one another; and
   a cleaning agent generator coupled to said support block.

19. The semiconductor wafer processing system of claim 18 wherein said support block comprises a support block channel for receiving a slidable piston coupled to said feed block.

20. The semiconductor wafer processing system of claim 18 wherein said feed block comprises a feed block channel for receiving a slidable piston coupled to said support block.

21. The semiconductor wafer processing system of claim 20 further comprising an o-ring disposed about said slidable piston and in contact with said feed block channel.

22. The semiconductor wafer processing system of claim 21 further comprising a seal adapter having a seal adapter channel, said seal adapter disposed between said feed block and said support block, and wherein said seal adapter channel is axially aligned with said feed block channel.

23. The semiconductor wafer processing system of claim 22 wherein said piston slidably moves relative to said seal adapter and said feed block.

24. The semiconductor wafer processing system of claim 23 wherein said dome temperature control assembly further comprises:
   a heating plate;
   a cooling plate adjacent to said heating plate;
   a temperature control assembly cross member disposed over said heating plate and said cooling plate, said temperature control assembly cross member coupled to at least one flange extending radially outward from said dome.

25. The semiconductor wafer processing system of claim 24 wherein said cross member is coupled to said flange via a spring loaded fastener.

26. The semiconductor wafer processing system of claim 23 further comprising a support structure coupled to said chamber for supporting said cleaning agent generator and said support block.

27. The semiconductor wafer processing system of claim 26 wherein said support block is disposed over said cross-members of said support structure.

28. The semiconductor wafer processing system of claim 26 wherein said support structure comprises four legs coupled to said sidewalls of said chamber, and four cross-members, each cross-member coupled to a pair of legs to form a rectangle.

29. The semiconductor wafer processing system of claim 22 further comprising a dome temperature control assembly disposed over said dome of said chamber and circumscribing said feed block.

30. The semiconductor wafer processing system of claim 29 wherein said support structure comprises:
   a plurality of legs coupled to opposing sidewalls of said chamber on a first end of said plurality of legs;
   a plurality of cross-members coupled to said plurality of legs at a second end of said plurality of legs.

31. The semiconductor wafer processing system of claim 30 further comprising an outer cover having a bore, said outer cover disposed over said dome, wherein said dome, said feed block, and said temperature control assembly are shrouded by said outer cover, and said piston protrudes through said outer cover bore such that said support block and cleaning agent generator are disposed above said outer cover.

32. The semiconductor wafer processing system of claim 20 wherein said cleaning agent generator is disposed on top of said support block.

33. The semiconductor wafer processing system of claim 32 wherein said chamber comprises a dome having a dome bore where said feed block channel is axially aligned with said dome bore.

34. The semiconductor wafer processing system of claim 18 wherein said feed block further comprises a process gas channel.

* * * * *

UNITED STATES PATENT AND TRADEMARK OFFICE
CERTIFICATE OF CORRECTION

PATENT NO. : 6,363,624 B1
DATED : April 2, 2002
INVENTOR(S) : Pang et al.

It is certified that error appears in the above-identified patent and that said Letters Patent is hereby corrected as shown below:

Column 2,
Line 28, please insert -- of -- after "one".

Column 3,
Line 3, please replace "shown" with -- shown) --.

Column 4,
Line 8, please delete "the" (first occurrence).

Column 5,
Line 10, please delete "a" after "be".

Column 7,
Line 51, please delete "channel".

Signed and Sealed this

Twenty-fourth Day of September, 2002

Attest:

JAMES E. ROGAN
Attesting Officer   Director of the United States Patent and Trademark Office